United States Patent
Usami et al.

[11] Patent Number: 6,166,911
[45] Date of Patent: Dec. 26, 2000

[54] SEMICONDUCTOR INTEGRATED CIRCUIT CARD ASSEMBLY

[75] Inventors: Mitsuo Usami, Akishima; Kunihiko Nishi, Kokubunji; Yoshikatsu Mikami, Shimodate; Masakatsu Suzuki, Ibaraki, all of Japan

[73] Assignees: Hitachi, Ltd.; Hitachi Chemical Company, Ltd., both of Tokyo, Japan

[21] Appl. No.: 08/930,057

[22] PCT Filed: May 22, 1996

[86] PCT No.: PCT/JP96/01348

§ 371 Date: Nov. 20, 1997

§ 102(e) Date: Nov. 20, 1997

[87] PCT Pub. No.: WO96/37917

PCT Pub. Date: Nov. 28, 1996

[30] Foreign Application Priority Data

May 23, 1995 [JP] Japan .................................. 7-123574

[51] Int. Cl.[7] .............................. H05K 7/14; H01Q 1/36; G06K 19/02

[52] U.S. Cl. .......................... 361/737; 361/761; 361/764; 235/492; 343/895; 257/679

[58] Field of Search ..................... 361/737, 761, 361/764; 235/380, 492; 902/26; 343/895; 257/679

[56] References Cited

U.S. PATENT DOCUMENTS

| | | | |
|---|---|---|---|
| 4,719,140 | 1/1988 | Hara et al. | 235/492 X |
| 4,754,319 | 6/1988 | Saito et al. | 257/679 X |
| 4,889,980 | 12/1989 | Hara et al. | 235/492 X |
| 5,574,470 | 11/1996 | De Vall | 343/895 |
| 5,608,417 | 3/1997 | De Vall | 343/895 |
| 5,671,525 | 9/1997 | Fidalgo | 235/492 X |
| 5,703,755 | 12/1997 | Flesher et al. | 361/737 |
| 5,714,744 | 2/1998 | Brice | 235/492 X |

FOREIGN PATENT DOCUMENTS

| | | |
|---|---|---|
| 0 706 152 | 6/1996 | European Pat. Off. . |
| 3535791 | 5/1986 | Germany . |
| 3-87299 | 4/1991 | Japan . |
| 7-99267 | 4/1995 | Japan . |

OTHER PUBLICATIONS

Copy of the PCT International Search Report for International Application No. PCT/JP96/01348.

Patent Abstracts of Japan issued by the European Patent Office for Japanse Publication No. JP 5278383, published on Oct. 26, 1993 in Japanese Application No. JP 920109058, filed on Apr. 3, 1992, entitled "IC Card".

See 1 in Addendum.

*Primary Examiner*—Jayprakash N. Gandhi
*Attorney, Agent, or Firm*—Dickstein Shapiro Morin & Oshinsky LLP

[57] ABSTRACT

Provided is a semiconductor assembly, comprising a circuit board (1) including a conductor circuit (4), the conductor circuit including connecting pads, a semiconductor chip (2) provided with connecting terminals provided on a first surface thereof, and mounted on the circuit board, a casing (5) covering the circuit board, wherein the connecting pads of the conductor circuit and the connecting terminals of the semiconductor chip are disposed in mutually opposing relationship, and are connected with each other by an electroconductive bonding agent, a neutral plane of the semiconductor chip substantially coinciding with an overall neutral plane of the semiconductor assembly.

11 Claims, 5 Drawing Sheets

( PRIOR ART)

FIG. 9

( PRIOR ART)

FIG. 10

SEMICONDUCTOR INTEGRATED CIRCUIT CARD ASSEMBLY

This is continuation of International Application PCT/JP96/01348, with an international filing date of May 22, 1996, the disclosure of which is incorporated into this application by reference.

TECHNICAL FIELD

The present invention relates to a semiconductor assembly which is both reliable and economical.

BACKGROUND OF THE INVENTION

The recent development in the filed of semiconductor devices has been dramatic, and the areas of application of semiconductor devices have been continually expanding. Simultaneously with the development in semiconductor chips which may be considered as the cores of the semiconductor devices, significant improvements have been made to the packaging of semiconductor chips.

For instance, various proposals have been made to improve the security and increase the convenience of prepaid cards such as magnetic cards for public telephones, personal identification cards such as vehicle operators licenses, and passes for train services.

Such IC cards may be characterized as consisting of a circuit board having a conductor circuit, a semiconductor chip mounted on the circuit board, optional electronic components such as capacitors, a device for receiving and transmitting signal into and out of the circuit board, and a casing for covering the circuit board as described in "Information Processing Handbook" compiled by Shadan Hojin Joho Shori Gakkai, published by KK Ohm, first edition, May 30, 1990, pages 302 to 304.

Figure 8:
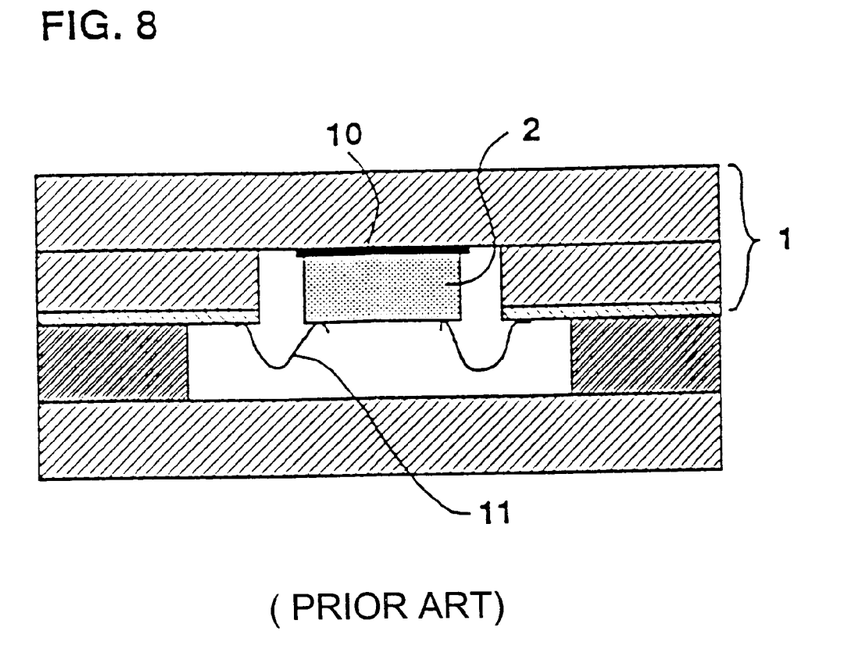
FIG. 8 is a sectional view showing a prior art example.

With regard to the structure of the IC card, it is also known, as illustrated in FIG. 8, to attach a semiconductor chip 2 to a card base board 1 by using a bonding agent 10, and connect the connecting terminals of the semiconductor chip and the connecting terminals of the card base board with bonding wire 11 as described in "IC Card" compiled by Shadan Hojin Joho Denshi Joho Tsushin Gakkail published by KK Ohm, first edition, May 25, 1990, page 33.

The thickness of the semiconductor chip contemplated herein is approximately from 200 to 400 $\mu$m , and the semiconductor chip is not highly resistant to bending stress so that there is a need to control the stress that is applied to the semiconductor chip. Therefore, the size of the semiconductor ship has to be limited, and/or the casing has to be made of a material resistant to bending stress.

As disclosed in Japanese patent laid-open (kokai) publication No. 3-87299, it is also known to make an IC card by preparing an IC module including an extremely thin LSI which is prepared by grinding the LSI to a reduced thickness while leaving the driver devices intact, and mounting this IC module in a recess provided on the surface of the package. An intrinsic problem with the IC card using an extremely thin LSI mounted on a relatively thick base board is a lack of reliability due to the fact that the thin LSI is vulnerable to the large tensile and compressive stresses that are applied to the front and rear surfaces of the LSI chips as the card base board undergoes a bending deformation.

Figure 9:
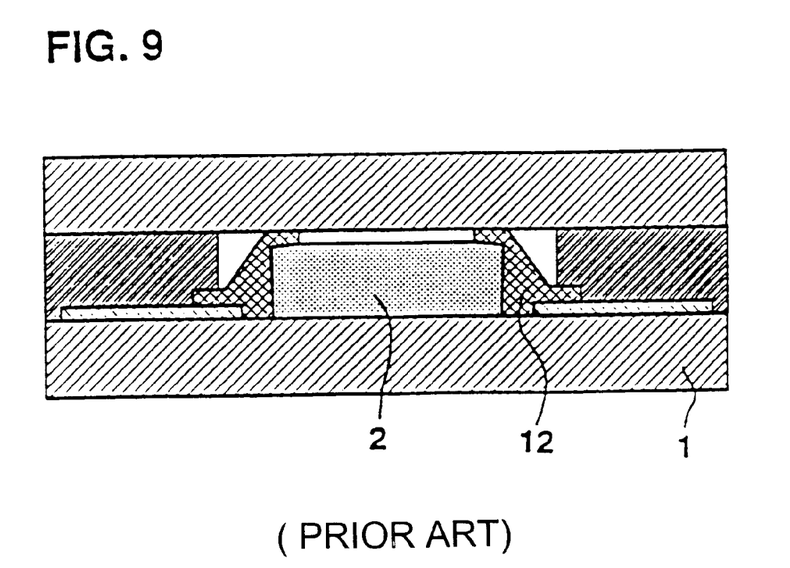
FIG. 9 is a sectional view showing another prior art example.

It was proposed in Japanese patent laid-open (kokai) publication No. 7-99267 to place the thin IC in a middle part of the thickness of the IC card as a method to overcome such a problem. According to this technology, as shown in FIG. 9, the semiconductor chip 2 is mounted on the printed circuit board 1 with the connecting terminals of the semiconductor chip and the connecting terminals of the printed circuit board exposed in a common plane, and the connecting terminals of the semiconductor chip and the connecting terminals of the printed circuit board are electrically connected with each other by printed electroconductive paste 12.

However, according to the method in which a semiconductor chip is mounted on a printed circuit board with the connecting terminals of the semiconductor chip and the connecting terminals of the printed circuit board exposed in a common plane, and the connecting terminals of the semiconductor chip and the connecting terminals of the printed circuit board are electrically connected with each other by printed electroconductive paste, when the IC card is generally subjected to a bending deformation, stress tends to concentrate in the boundary between the connecting terminals of the semiconductor chip and the connecting terminals of the printed circuit board, and cracks may generate in the electroconductive paste with the result that a high risk of electric disconnection exists.

BRIEF SUMMARY OF THE INVENTION

In view of such problems of the prior art, a primary object of the present invention is to provide a semiconductor assembly which provides a high level of reliability with regard to electric connection, and which is economical to manufacture.

A second object of the present invention is to provide a semiconductor assembly which can withstand repeated bending deformation.

A third object of the present invention is to provide a semiconductor assembly which suitable for use as an IC card.

These and other objects of the present invention can be accomplished by providing a semiconductor assembly, comprising: a circuit board including a conductor circuit, the conductor circuit including connecting pads; a semiconductor chip provided with connecting terminals provided on a first surface thereof, and mounted on the circuit board; a casing covering the circuit board; wherein the connecting pads of the conductor circuit and the connecting terminals of the semiconductor chip are disposed in mutually opposing relationship, and are connected with each other by an electroconductive bonding agent, a middle part of a thickness of the semiconductor chip substantially coinciding with an overall middle part of a thickness of the semiconductor assembly.

Preferably, the electroconductive bonding agent consists of anisotropic electroconductive bonding film. The conductor circuit may be formed by depositing electroconductive ink on the circuit board, for instance, by screen printing, or by selectively etching a layer of metallic foil such as copper foil formed on the circuit board. The conductor circuit may further comprise an antenna circuit which is formed at least on one surface of the circuit board.

According to the present invention, because the connecting terminals of the semiconductor chip and the conductor circuit of the circuit board are placed opposite to each other, the thickness of the connecting parts can be reduced, and the step of electric connection can be simplified as opposed to the conventional method based on the process of wire bonding or the method based on the application of electroconductive ink.

By attaching a plurality of layers of plastic film, plastic sheets or plastic sheets coated with a bonding agent to the upper and lower surfaces of the circuit board so as to place the semiconductor chip in a mid point of the thickness of the assembly, it is possible to minimize the concentration of stress in electric connection when the assembly is subjected to a bending stress.

Furthermore, by using electroconductive ink for conductor circuit of the circuit board, it is possible to produce more economical and smoother IC cards than was possible heretofore.

A spacer, typically consisting of film coated with a bonding agent, is preferably attached to a surface of the circuit board, the film being with provided with a cut-out for receiving the semiconductor chip therein. This provides a convenient means for defining a recess for accommodating a semiconductor chip therein without causing any irregularities to appear on the external surfaces of the assembly. In particular, by setting the gap defined between the outer profile of the semiconductor chip of the electronic component and the outer periphery of the cut-out in the spacer within the prescribed range, it is possible to eliminate any bubbles which may otherwise trapped in the gap, and to provide an IC card which is reliable and provided with a smooth surface.

The semiconductor chip used in the present invention is desired to be as thin as possible, and may be of any general type without any restriction.

The insulating material for the circuit board may consist of common plastic film or a plastic sheet such as polycarbonate film, polyethylene film, polyethylene terephthalate film, polyimide film, and PVC film, or a plastic sheet reinforced by glass fibers. In particular, polyethylene terephthalate film is highly desirable in terms of mechanical strength and cost. Commercially available materials include Diafoil (tradename, Diafoil Hoekist KK), Teijin Tetron film (tradename, Teijin KK), and Toyobo Ester film (tradename, Toyobo KK).

It is possible form an circuit conductor pattern on the surface of the film by depositing etching resist on a film laminated with a copper layer by using a bonding agent, and removing unnecessary part of the copper layer by etching, or, alternatively, by applying electroconductive paste on the surface of the film by screen printing, and curing the paste.

The electroconductive bonding agent used in the present invention may consist of polyester resin, phenol resin or epoxy resin mixed with electroconductive particles such as silver particles and copper particles. Commercially available materials include LS-3015HV, LS-1048, and ACP-105 (tradenames, made by KK Asahi Kagaku Kenkyusho), and FA-705A, XA-220, XA-412, D-723S, and XA-256M (tradenames, made by Fujikura Kasei KK).

It is also possible to use anisotropic electroconductive bonding film instead of such bonding agents, and Anisolm (tradename, Hitachi Kasei Kogyo KK) may be selected from those commercially available.

The bonding agent that can be used for the present invention may consist of polyester resin, epoxy resin or acrylonitrile resin.

The plastic film, plastic sheet or plastic sheet reinforced by glass fibers, on which the bonding agent is applied, may be provided with cut-outs in parts thereof corresponding to the locations where semiconductor chips and electronic component parts are mounted.

The size of each of the cut-outs may be selected according to the thickness of the semiconductor chip or the electronic component part. For instance, when the thickness of the semiconductor chip or the electronic component part is from 110 to 260 µm, the gap between the outer profile of the semiconductor chip or the electronic component part and the inner profile of the cut-out formed in the spacer is preferably from 50 to 500 µm. Further, the gap is preferably from 50 to 1,000 µm when the thickness of the semiconductor chip or the electronic component part is from 50 to 110 µm, and the gap is preferably from 50 to 2,000 µm when the thickness of the semiconductor chip or the electronic component part is from 0.5 to 50 µm.

If the gap is greater than the prescribed range, the surface of the finished card may be provided with large irregularities. If the gap is smaller than the prescribed range, positioning becomes unduly difficult.

BRIEF DESCRIPTION OF THE DRAWINGS

Now the present invention is described in the following with reference to the appended drawings, in which.

DETAILED DESCRIPTION OF THE PREFERRED EMBODIMENTS

Embodiment 1

Figure 1:
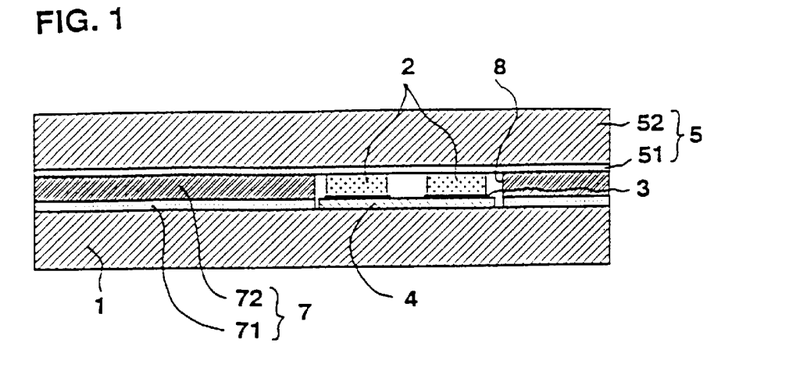
FIG. 1 is a sectional view showing an embodiment of the present invention.
Figure 2:
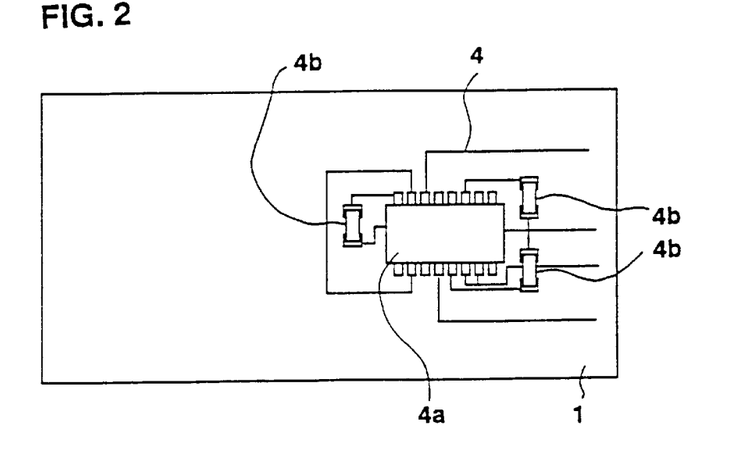
FIG. 2 is a plan view of a part of the assembly of FIG. 1.
Figure 3:
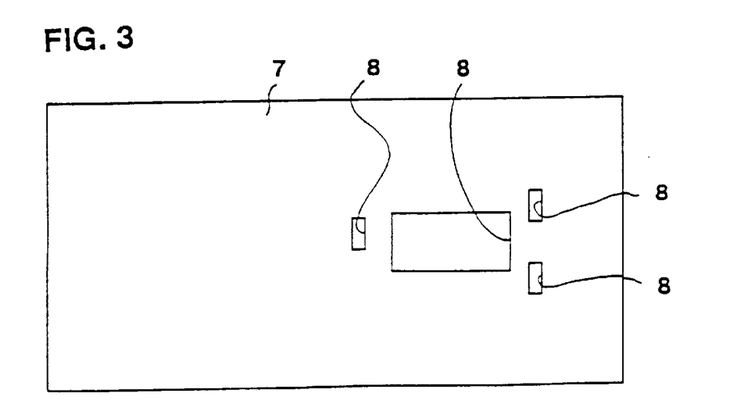
FIG. 3 is a plan view of the spacer shown in FIGS. 1 and 2.

As shown in FIGS. 1 and 2, semiconductor and other electronic chips 2 (IC and capacitors) which are 30 µm in thickness were attached to a surface of a circuit board 1 having a circuit 4 printed thereon, by using an electroconductive paste 3 (FA-320, tradename, made by KK Asahi Kagaku Kenkyusho). It is also possible to form the printed circuit 4 by selectively etching a layer of copper foil. A spacer sheet 7 having cut-outs 8 was placed over the surface of the circuit board 1. FIG. 3 shows the spacer 7 in a plan view. The cut-outs 8 were dimensioned so as to define a gap of 50 to 2,000 µm around each of the chips. In this embodiment, the spacer sheet 7 comprises 25 µm thick polyethylene terephthalate film 72 coated with a 25 µm thick bonding agent layer 71, and a 1 µm thick primer layer which is not shown in the drawing. Additionally, a casing consisting of 125 µm thick polyethylene terephthalate film 52 coated with a 20 µm thick bonding agent layer 51 and serving as an upper cover, was laminated over the spacer 7 by using a laminator. Once this lamination process was completed, the chips were placed in the neutral plane of the IC card which is 326 µm in thickness. In other words, the semiconductor chips 2 were placed substantially in a middle part of the thickness of the IC card. Because the compressive and tensile stress due to the bending deformation of the IC card increases linearly with in proportion to the distance from the neutral plane, the semiconductor chips 2 are substantially free from compressive and tensile stresses. The neutral plane as defined here may be a geometrical neutral plane when the IC card assembly is substantially uniform, but may be offset from the geometrical neutral plane if there is any asymmetricity about the geometrical neutral plane in the structure of the IC card as well known in the field of mechanics.

Embodiment 2

Figure 4:
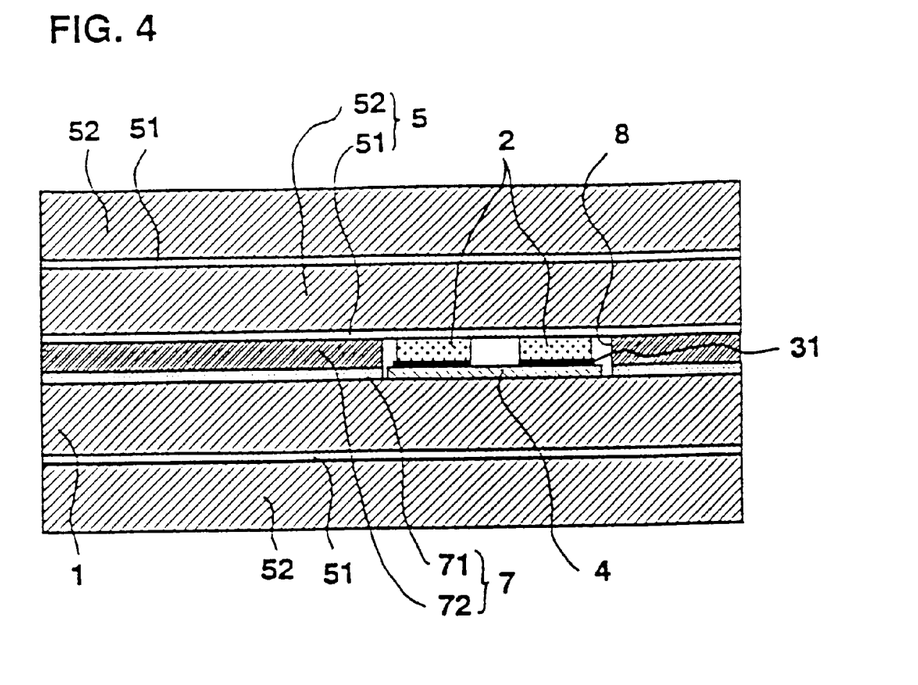
FIG. 4 is a view similar to FIG. 1 showing another embodiment of the present invention.

As shown in FIG. 4, an additional layer of 75 μm thick polyethylene terephthalate film 52 coated with a 20 μm thick bonding agent layer 51 was laminated over the upper and lower surfaces of the IC card of Embodiment 1 to produce an IC card which was 516 μm in thickness. Thus, the casing 5, in this case, comprises a pair of upper layers 52 and a single lower layer 52.

Embodiment 3

Similarly to Embodiment 2, an additional layer of 188 μm thick polyethylene terephthalate film 52 coated with a 20 μm thick bonding agent layer 51 was laminated over the upper and lower surfaces of the IC card of Embodiment 1 to produce an IC card which was 742 μm in thickness.

Embodiment 4

30 μm thick chips 2 were used in place of the 50 μm thick chips of Embodiment 1, and a 50 μm thick spacer 7 made of polyethylene terephthalate was used to produce an IC card which was 346 μm in thickness.

Embodiment 5

An additional layer of 75 μm thick polyethylene terephthalate film 52 coated with a 20 μm thick bonding agent layer 51, was laminated over the upper and lower surfaces of the IC card of Embodiment 4 to produce an IC card which was 536 μm in thickness as shown in FIG. 4

Embodiment 6

Similarly to Embodiment 5, a cover film, an additional layer of 188 μm thick polyethylene terephthalate film 52 coated with a 20 μm thick bonding agent layer 51 was laminated over the upper and lower surfaces of the IC card of Embodiment 4 to produce an IC card which was 762 μm in thickness.

Embodiment 7

100 μm thick semiconductor chips 2 were used in place of the chips of Embodiment 1, and a 100 μm thick spacer 7 made of polyethylene terephthalate film 72 was used to produce an IC card which was 346 μm in thickness. The cut-outs 8 were provided such that a gap of 50 to 1,000 μm was defined around each of the chips 2 which may consist of ICs and other electronic components.

Embodiment 8

An additional layer of 75 μm thick polyethylene terephthalate film 52 coated with a 20 μm thick bonding agent layer 51 was laminated over the upper and lower surfaces of the IC card of Embodiment 7 to produce an IC card which was 586 μm in thickness as shown in FIG. 4.

Embodiment 9

Similarly to Embodiment 8, an additional layer of 188 μm thick polyethylene terephthalate film 52 coated with a 20 μm thick bonding agent layer 51 was laminated over the upper and lower surfaces of the IC card of Embodiment 7 to produce an IC card which was 812 μm in thickness.

Embodiment 10

200 μm thick chips 2 were used in place of the chip of Embodiment 1, and a 188 μm thick spacer 7 made of polyethylene terephthalate film 72 was used to produce an IC card which was 496 μm in thickness. The cut-outs 8 were provided such that a gap of 50 to 500 μm was defined around each of the chips 2.

Embodiment 11

An additional layer of 75 μm thick polyethylene terephthalate film 52 coated with a 20 μm thick bonding agent layer 51, was laminated over the upper and lower surfaces of the IC card of Embodiment 10 to produce an IC card which was 686 μm in thickness as shown in FIG. 4.

Embodiment 12

Similarly to Embodiment 11, an additional layer of 188 μm thick polyethylene terephthalate film 52 coated with a 20 μm thick bonding agent layer 51 was laminated over the upper and lower surfaces of the IC card of Embodiment 10 to produce an IC card which was 912 μm in thickness.

Embodiment 13

500 μm thick chips 2 were used in place of the chips of Embodiment 1, and a 500 μm thick spacer 7 made of polyethylene terephthalate film 72 was used to produce an IC card which was 796 μm in thickness.

Embodiment 14

An additional layer of 75 μm thick polyethylene terephthalate film 52 coated with a 20 μm thick bonding agent layer 51 was laminated over the upper and lower surfaces of the IC card of Embodiment 13 to produce an IC card which was 986 μm in thickness as shown in FIG. 4.

Embodiment 15

Similarly to Embodiment 14, an additional layer of 188 μm thick polyethylene terephthalate film 52 coated with a 20 μm thick bonding agent layer 51 was laminated over the upper and lower surfaces of the IC card of Embodiment 10 to produce an IC card which was 1,212 μm in thickness.

Embodiment 16

Figure 5:
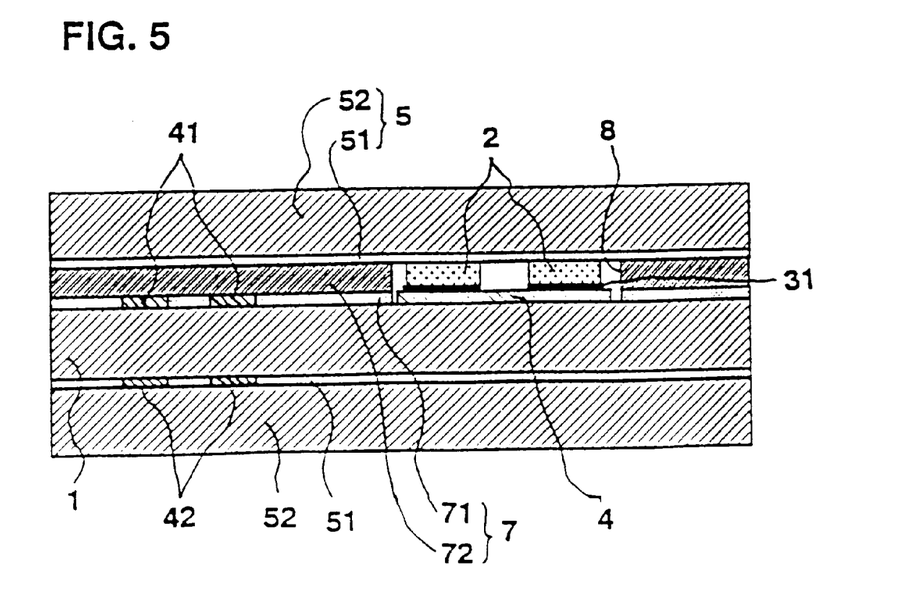
FIG. 5 is a view similar to FIG. 1 showing yet another embodiment of the present invention.
Figure 6:
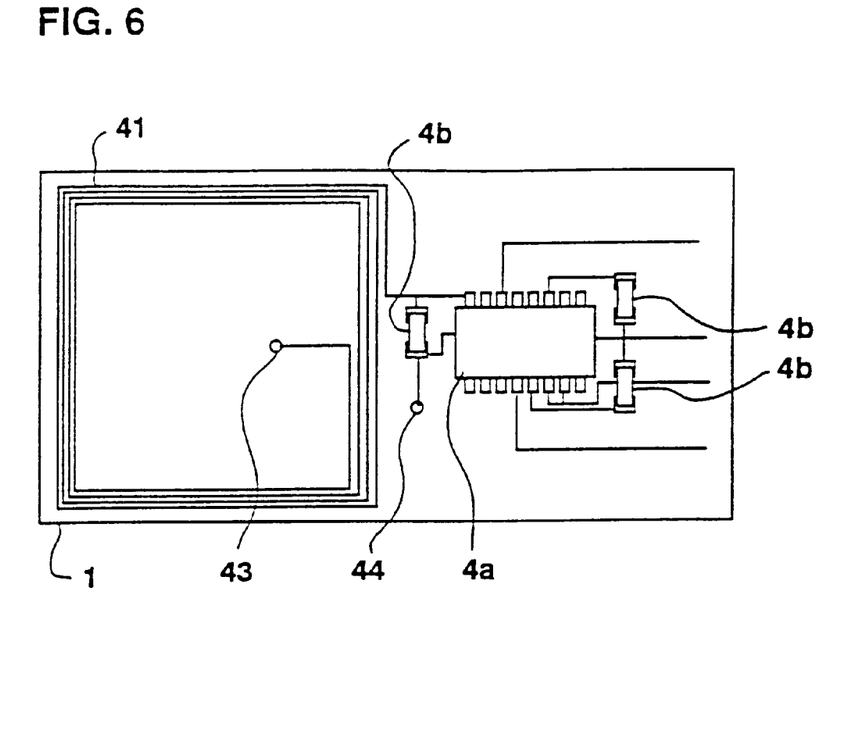
FIG. 6 is a plan view of the front surface the circuit board of FIG. 5.
Figure 7:
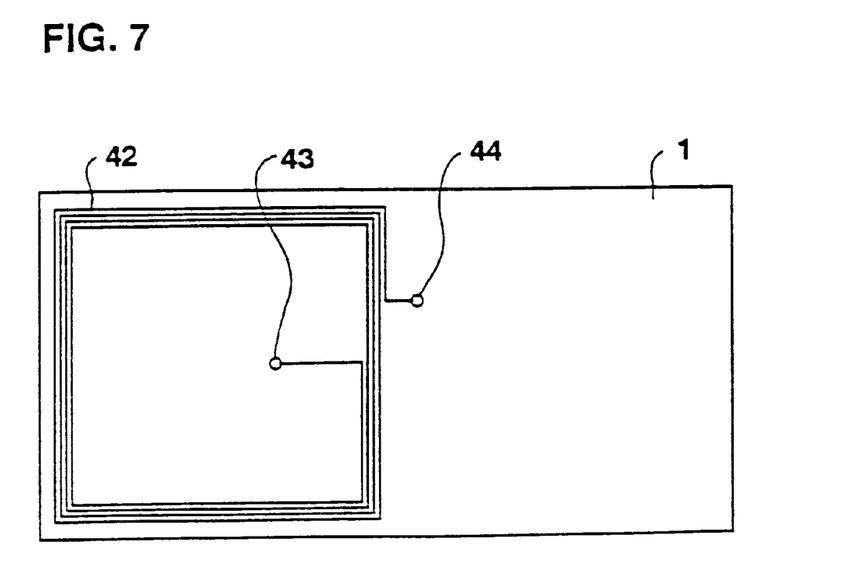
FIG. 7 is a plan view of the reverse surface of the circuit board of FIG. 5.

Referring to FIGS. 5 to 7 in which the parts corresponding to the previous embodiments are denoted with like numerals, a printed circuit board 1 was formed by placing an antenna circuit 41, consisting of a 18 μm thick electroconductive layer, over the both surfaces of a 75 μm thick polyethylene terephthalate film layer, and semiconductor chips and capacitor chips 4a and 4b which are 50 μm in thickness were mounted on this printed circuit board 1 by using an anisotropic electroconductive film 31 marketed under the trade name of Anisolm so as to form a functional part of an IC card.

An antenna coil 41 and 42 was formed on each side of the 75 μm thick polyethylene terephthalate film, and the two coils on the upper and lower surfaces of the film were connected with each other via through holes 43 and 44 provided in prescribed parts of the circuit board 1 in advance.

Three layers of spacer film 71 were placed over this functional part, and a pair of cover film layers 52, consisting of 188 μm and 75 μm thick polyethylene terephthalate coated with a 24 μm thick bonding agent, were laminated over the upper and lower surfaces of the assembly, respectively, by using a laminator so as to form an IC card which was 474 μm in thickness after the lamination process.

Embodiment 17

A pair of cover film layers 51, consisting of 250 μm and 125 μm thick polyethylene terephthalate film, were used in place of the 188 μm thick upper cover film and the 75 μm thick lower cover film of Embodiment 16, respectively, so as to obtain an IC card which was 574 μm in thickness.

Embodiment 18

125 μm thick polyethylene terephthalate film was used for the printed circuit board 1 instead of the 75 μm thick film of Embodiment 16 to thereby improve the printing precision. Additionally, two layers 51 of cover film, measuring 188 μm and 100 μm , respectively, in thickness, were used for the upper cover film, and 125 μm thick film was used in place of the 75 µm thick lower cover film so as to obtain an IC card which was 720 µm in thickness.

Embodiment 19

In Embodiments 10 and 13, surface irregularities exceeding 100 µm were produced on the surfaces of the IC cards under the condition of L−K>500 µm where K is the dimension of the chip, and L is the dimension of the cut-out 8 in the spacer. These irregularities may be attributed to the excessive size of the internal gaps, and were reduced to 80 µm or less by adjusting so that L−K<500 µm.

Embodiment 20

In Embodiment 7, surface irregularities exceeding 100 µm were produced on the surfaces of the IC cards under the condition of L−K>1,000 µm. These irregularities may be attributed to the excessive size of the internal gaps, and were reduced to 80 µm or less by adjusting so that L−K<1,000 µm.

Embodiment 21

In Embodiment 4, surface irregularities exceeding 100 µm were produced on the surfaces of the IC cards under the condition of L−K>2,000 µm. These irregularities may be attributed to the excessive size of the internal gaps, and were reduced to 80 µm or less by adjusting so that L−K<2,000 µm.

Figure 10:
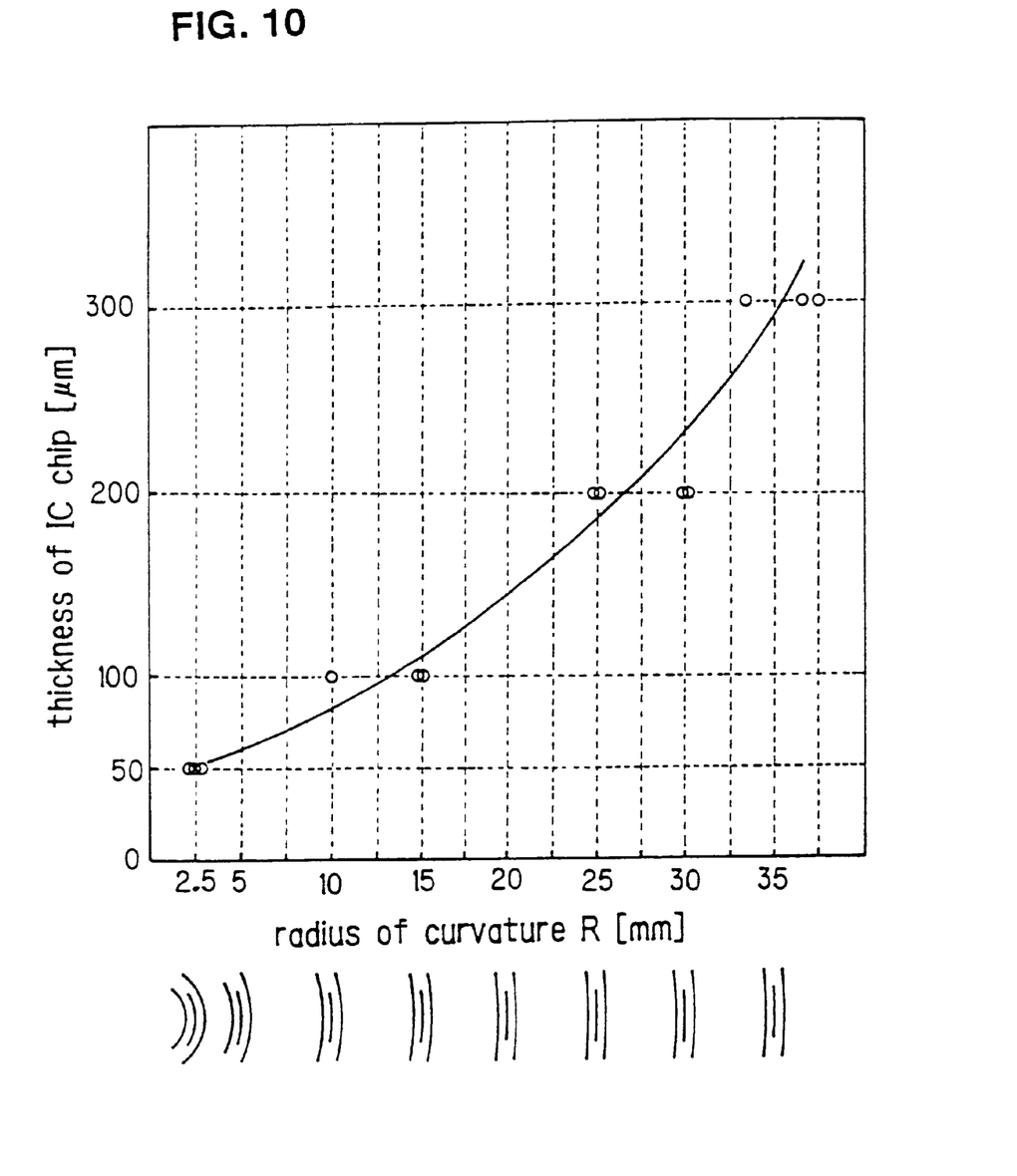
FIG. 10 is a graph showing the relationship between minimum tolerable radius of curvature and the thickness of the semiconductor chip.

The reliability of electric connection in the thus prepared IC cards when subjected to bending deformation was tested. Physical damages have been observed in some cases, but no electric disconnection occurred for the 50 µm thick IC chips when the radius of curvature is from 2.5 to 5 mm, for the 100 µm thick IC chips when the radius of curvature is from 10 to 15 mm, and for the 200 µm thick IC chips when the radius of curvature is from 25 to 30 mm. FIG. 10 is a graph showing the relationship between minimum tolerable radius of curvature and the thickness of the semiconductor chip which was experimentally obtained by using the arrangement of Embodiment 1.

For comparison, IC cards were prepared according to the teaching of Japanese patent laid-open publication No. 7-99267 by mounting a semiconductor chip on a circuit base board with the connecting terminals of the semiconductor chip and the connecting terminals of the circuit base board exposed on a common plane, and connecting these connecting terminals with each other by using electroconductive paste. The materials were identical to those used in Embodiment 1, and the final thickness was matched with those according to the present invention. According to these IC cards for comparison, electric disconnections occurred in 20 to 40% of the cases for the same range of bending deformation, which proves a high level of reliability of electric connection in the IC cards prepared according to the present invention. Thus, the device of the present invention is highly reliable with regard to electric connection, and economical to manufacture.

Although the present invention has been described in terms of specific embodiments thereof, it is possible to modify and alter details thereof without departing from the spirit of the present invention.

What is claimed is:

1. A semiconductor assembly, comprising:
   a circuit board (1) including a conductor circuit (4);
   a semiconductor chip (2) mounted on said circuit board (1); and
   a casing (5) covering said circuit board(l);
   wherein said conductor circuit (4) and said semiconductor chip (2) are disposed in mutually opposing relationship, and are connected with each other by an electroconductive bonding agent (3), a middle part of a thickness of said semiconductor chip (2) coinciding with an overall middle part of a thickness of said semiconductor assembly and wherein said conductor circuit further comprises an antenna circuit (41, 42) which is formed at least on one surface of said circuit board;
   wherein said semiconductor chip has a thickness of no more than 200 µm.

2. A semiconductor assembly according to claim 1, wherein said electroconductive bonding agent consists of an anisotropic electroconductive bonding film (31).

3. A semiconductor assembly according to claim 1, wherein said conductor circuit is formed by depositing an electroconductive ink on said circuit board.

4. A semiconductor assembly according to claim 1, wherein said conductor circuit is formed by selectively etching a layer of metallic foil formed on said circuit board.

5. A semiconductor assembly according to claim 1, wherein a spacer (7) consisting of film coated with a bonding agent is attached to a surface of said circuit board, said film being provided with a cut-out (8) for receiving said semiconductor chip therein.

6. A semiconductor assembly according to claim 5, wherein a gap between a peripheral part of said semiconductor chip and a surrounding edge of said cut-out is sufficiently small to avoid any unacceptable surface irregularities from developing in said assembly.

7. A semiconductor assembly according to claim 1, wherein a gap between a peripheral part of said semiconductor chip and a surrounding edge of said cut-out is sufficiently small so that L−K<2,000 µm where L is a dimension of said cut-out and K is a corresponding dimension of said semiconductor chip.

8. A semiconductor assembly according to claim 1, wherein said casing comprises plastic film placed over said circuit board.

9. A semiconductor assembly according to claim 1, wherein said connecting pads of said conductor circuit is attached to an overall opposing surface of said connecting terminals of said semiconductor chip.

10. A semiconductor assembly comprising:
    a circuit board including a conductor circuit;
    a semiconductor chip mounted on said circuit board; and
    a casing covering two sides of said circuit board, wherein said casing includes a polyethylene terephthalate film;
    wherein said conductor circuit and said semiconductor chip are disposed in mutually opposing relationship, and are connected with each other by an electroconductive bonding agent, a middle part of a thickness of said semiconductor chip coinciding with an overall middle part of a thickness of said semiconductor assembly and wherein said conductor circuit further comprises an antenna circuit including at least one antenna coil formed on the surfaces of said circuit board and wherein said at least one antenna coil is covered by the polyethylene terephthalate film of said casing;
    wherein said semiconductor chip has a thickness of no more than 200 µm.

11. A semiconductor assembly comprising:

a circuit board including a conductor circuit;

a semiconductor chip mounted on said circuit board, wherein said semiconductor chip has a thickness of about 110 µm or less;

a casing covering said circuit board; and wherein said conductor circuit and said semiconductor chip are disposed in mutually opposing relationship, and are connected with each other by an anisotropic electroconductive bonding agent, a middle part of a thickness of said semiconductor chip coinciding with an overall middle part of a thickness of said semiconductor assembly and wherein said conductor circuit further comprises an antenna circuit which is formed at least on one surface of said circuit board.

\* \* \* \* \*